(12) United States Patent
Quan et al.

(10) Patent No.: US 9,491,854 B2
(45) Date of Patent: Nov. 8, 2016

(54) MULTI-LAYER MICROWAVE CORRUGATED PRINTED CIRCUIT BOARD AND METHOD

(71) Applicant: RAYTHEON COMPANY, Waltham, MA (US)

(72) Inventors: Clifton Quan, Arcadia, CA (US); Hee Kyung Kim, El Segundo, CA (US); Fangchou Yang, Los Angeles, CA (US); Kevin C. Rolston, Westchester, CA (US); Edward Marsh Jackson, Long Beach, CA (US)

(73) Assignee: RAYTHEON COMPANY, Waltham, MA (US)

( * ) Notice: Subject to any disclaimer, the term of this patent is extended or adjusted under 35 U.S.C. 154(b) by 193 days.

(21) Appl. No.: 13/865,730

(22) Filed: Apr. 18, 2013

(65) Prior Publication Data
US 2013/0319732 A1    Dec. 5, 2013

Related U.S. Application Data

(63) Continuation of application No. 12/534,077, filed on Jul. 31, 2009, now abandoned.

(51) Int. Cl.
*H05K 1/02*        (2006.01)
*H05K 3/36*        (2006.01)
(Continued)

(52) U.S. Cl.
CPC .............. *H05K 1/028* (2013.01); *H05K 1/024* (2013.01); *H05K 1/147* (2013.01); *H05K 3/361* (2013.01);
(Continued)

(58) Field of Classification Search
CPC ...... H05K 1/024; H05K 1/147; H05K 3/361; H05K 1/028
USPC ......................................... 174/254
See application file for complete search history.

(56) References Cited

U.S. PATENT DOCUMENTS 3,004,229 A    10/1961   Stearns
4,128,677 A *  12/1978   Hoelzinger ................ 428/57
(Continued)

FOREIGN PATENT DOCUMENTS

EP     2 230 775 A2    9/2010
EP     2 288 242 A1    2/2011
(Continued)

OTHER PUBLICATIONS

Extended European Search Report for European Application No. 10251312.4, filed Jul. 23, 2010, Extended European Search Report dated Nov. 23, 2010 and mailed Dec. 10, 2010 (6 pgs.).
(Continued)

*Primary Examiner* — William H Mayo, III
*Assistant Examiner* — Hiram E Gonzalez
(74) *Attorney, Agent, or Firm* — Lewis Roca Rothgerber Christie LLP

(57) ABSTRACT

A multi-layer microwave corrugated printed circuit board is provided. In one embodiment, an interconnect assembly includes a first flat flexible layer having a signal conductor and a ground conductor forming a first microstripline or microstrip transmission line, a second folded flexible layer having a signal conductor and a ground conductor forming a second microstripline or microstrip transmission line, the bottom surface of the second folded flexible layer having ridge portions, a non-conductive adhesive layer disposed between the top surface of the first flat flexible layer and the ridge portions of the second folded flexible layer, a signal through-hole extending through the non-conductive adhesive layer and the first flat flexible layer, and two ground through-holes extending through the non-conductive adhesive layer and the second folded flexible layer, wherein the two ground through-holes are disposed on opposite sides of the signal through-hole.

11 Claims, 9 Drawing Sheets

(51) Int. Cl.
    *H05K 1/14* (2006.01)
    *H05K 3/40* (2006.01)
    *H05K 3/46* (2006.01)

(52) U.S. Cl.
    CPC ............ *H05K 1/144* (2013.01); *H05K 3/4069* (2013.01); *H05K 3/4614* (2013.01); *H05K 3/4635* (2013.01); *H05K 2201/055* (2013.01); *H05K 2201/058* (2013.01); *H05K 2201/09109* (2013.01); *H05K 2201/09318* (2013.01); *H05K 2201/10378* (2013.01); *H05K 2203/063* (2013.01); *Y10T 29/49126* (2015.01); *Y10T 29/49155* (2015.01)

(56) References Cited

U.S. PATENT DOCUMENTS

| | | | |
|---|---|---|---|
| 4,853,660 | A | 8/1989 | Schloemann |
| 5,097,101 | A | 3/1992 | Trobough |
| 5,262,590 | A | 11/1993 | Lia |
| 5,408,240 | A | 4/1995 | Battista et al. |
| 5,526,565 | A | 6/1996 | Roberts |
| 5,633,615 | A | 5/1997 | Quan |
| 6,018,326 | A | 1/2000 | Rudisill |
| 6,061,245 | A | 5/2000 | Ingraham et al. |
| 6,366,185 | B1 | 4/2002 | Keesey et al. |
| 6,444,921 | B1 * | 9/2002 | Wang et al. ............... 174/260 |
| 6,696,163 | B2 | 2/2004 | Yang |
| 6,871,396 | B2 | 3/2005 | Sugaya et al. |
| 6,992,629 | B2 * | 1/2006 | Kerner ............... H01P 5/085 333/246 |
| 7,298,331 | B2 | 11/2007 | Oberly |
| 7,523,548 | B2 | 4/2009 | Kataoka et al. |
| 7,525,498 | B2 | 4/2009 | Quan et al. |
| 7,645,941 | B2 | 1/2010 | Wesselman et al. |
| 7,992,293 | B2 | 8/2011 | Carmi |
| 8,043,464 | B2 | 10/2011 | Kim et al. |
| 8,453,314 | B2 | 6/2013 | Viscarra et al. |
| 2005/0264448 | A1 | 12/2005 | Cox et al. |
| 2006/0097945 | A1 | 5/2006 | McCarville et al. |
| 2007/0025044 | A1 | 2/2007 | Golubovic et al. |
| 2007/0131451 | A1 | 6/2007 | Schmachtenberg, III et al. |
| 2007/0139275 | A1 | 6/2007 | Deaett et al. |
| 2008/0088519 | A1 * | 4/2008 | Quan et al. ............... 343/770 |
| 2009/0165296 | A1 | 7/2009 | Carmi |
| 2009/0231226 | A1 | 9/2009 | Quan et al. |
| 2011/0113618 | A1 | 5/2011 | Viscarra et al. |
| 2011/0113619 | A1 | 5/2011 | Viscarra et al. |
| 2011/0114242 | A1 | 5/2011 | Kim et al. |
| 2011/0115578 | A1 | 5/2011 | Quan et al. |

FOREIGN PATENT DOCUMENTS

| | | | |
|---|---|---|---|
| FR | 2 871 336 A1 | 12/2005 |
| GB | 2 064 233 A | 6/1981 |
| JP | 8 051279 A | 2/1996 |
| JP | 9 281520 A | 10/1997 |
| JP | 2001-135899 A | 5/2001 |
| JP | 2001-189609 A | 7/2001 |
| JP | 2003-347503 A | 12/2003 |
| JP | 2007-221077 A | 8/2007 |
| WO | WO 2008/045349 A1 | 4/2008 |

OTHER PUBLICATIONS

Office Action mailed May 16, 2011 for U.S. Appl. No. 12/620,562, filed Nov. 17, 2009, Inventor Alberto F. Viscarra, et al. (11 pgs.).

Office Action mailed Jun. 8, 2011 for U.S. Appl. No. 12/620,544, filed Nov. 17, 2009, Inventor Alberto F. Viscarra, et al. (14 pgs.).

Extended European Search Report for European Application No. 10251577.2, filed Sep. 10, 2010, Extended European Search Report dated Feb. 24, 2011 and mailed Mar. 4, 2011 (5 pgs.).

Extended European Search Report for European Application. No. 10251576.4, filed Sep. 10, 2010, Extended European Search Report dated Feb. 24, 2011 and mailed Mar. 4, 2011 (6 pgs.).

Extended search report for European. Application No, 10251575.6-1248, Raytheon Company, European extended search report dated Jun. 8, 2011 and mailed Jun. 16, 2011 (8 pgs.).

First Office Action mailed May 29, 2012 in Japan Patent Application No. 2010-171363, filed Jul. 30, 2010 (3 pages).

English translation of First Office Action mailed May 29, 2012 in Japan Patent Application No. 2010-171363, filed Jul. 30, 2010 (4 pages).

* cited by examiner

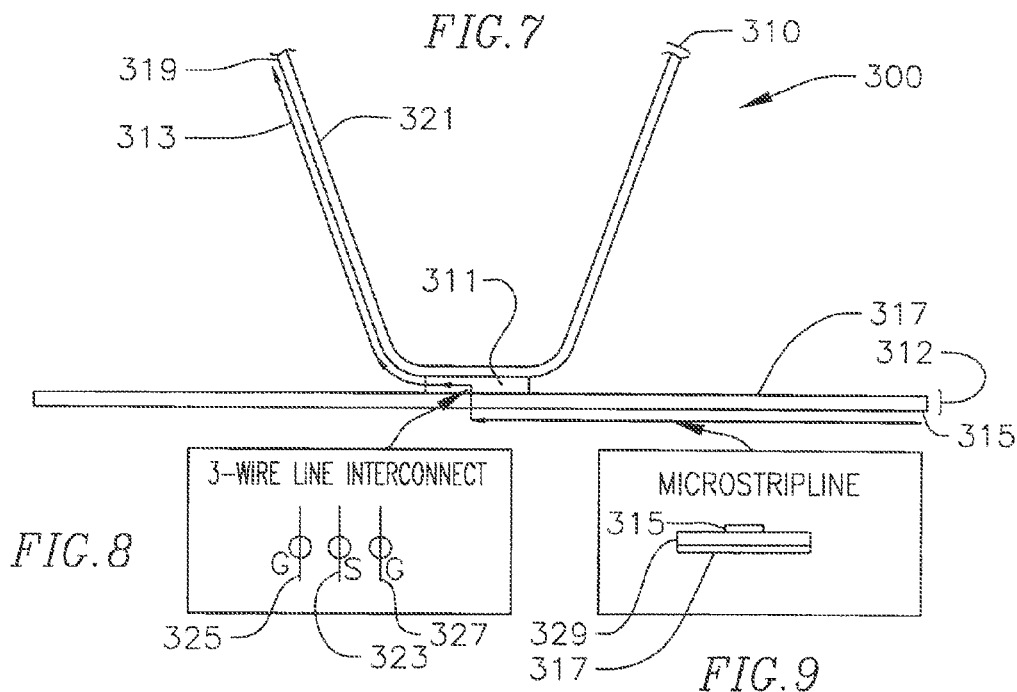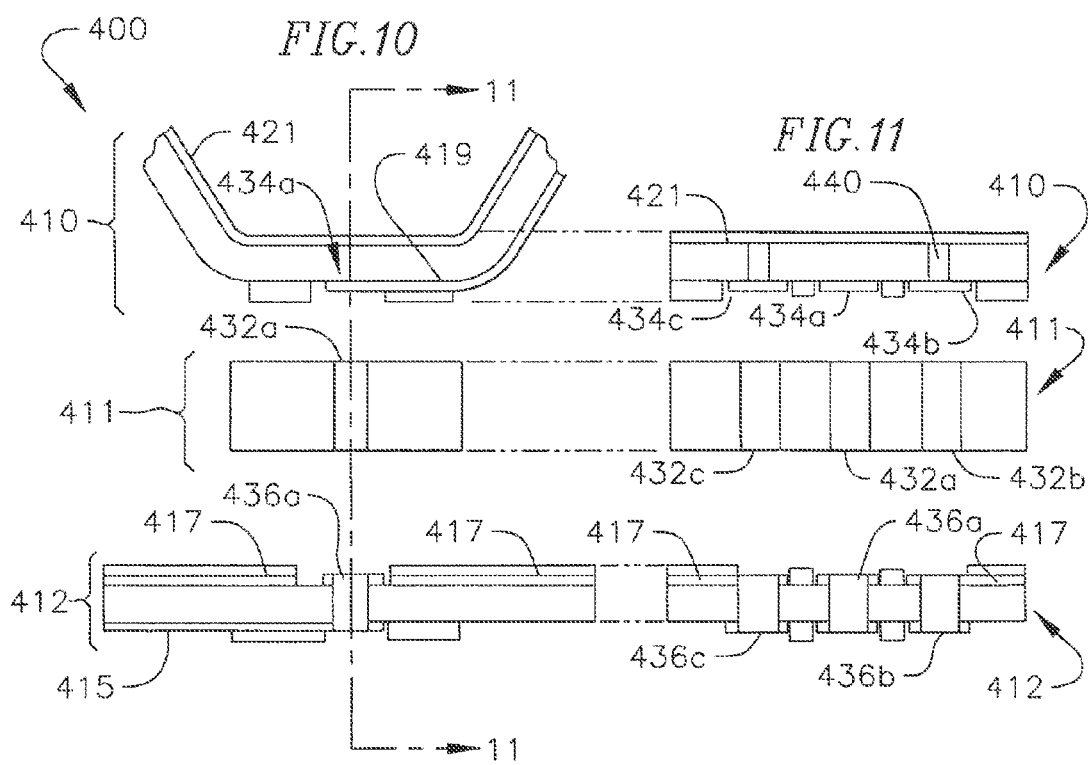

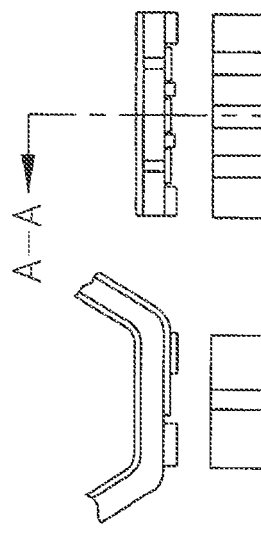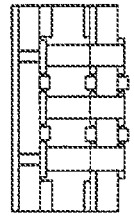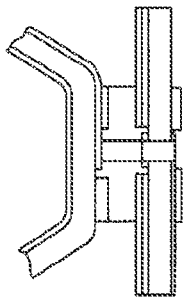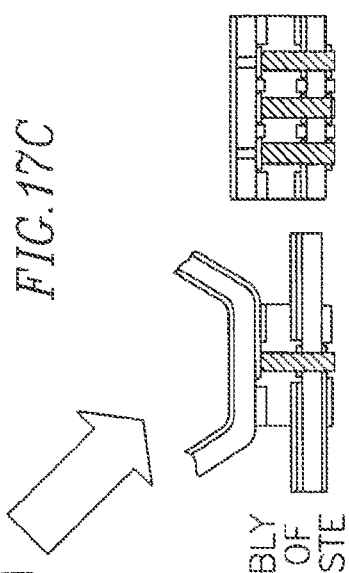

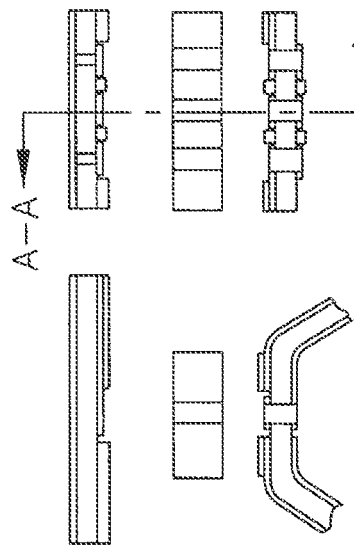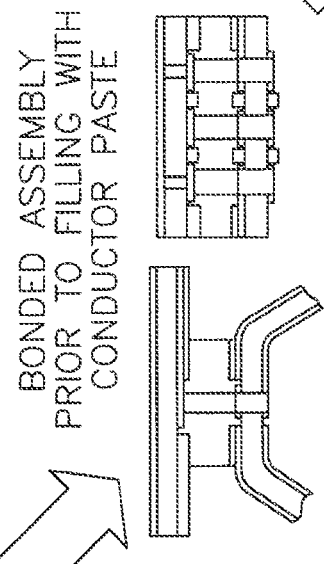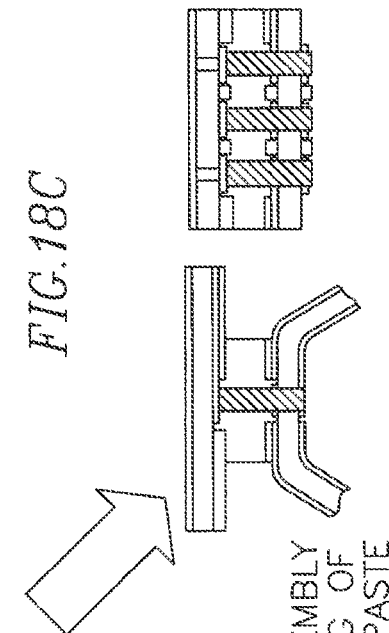

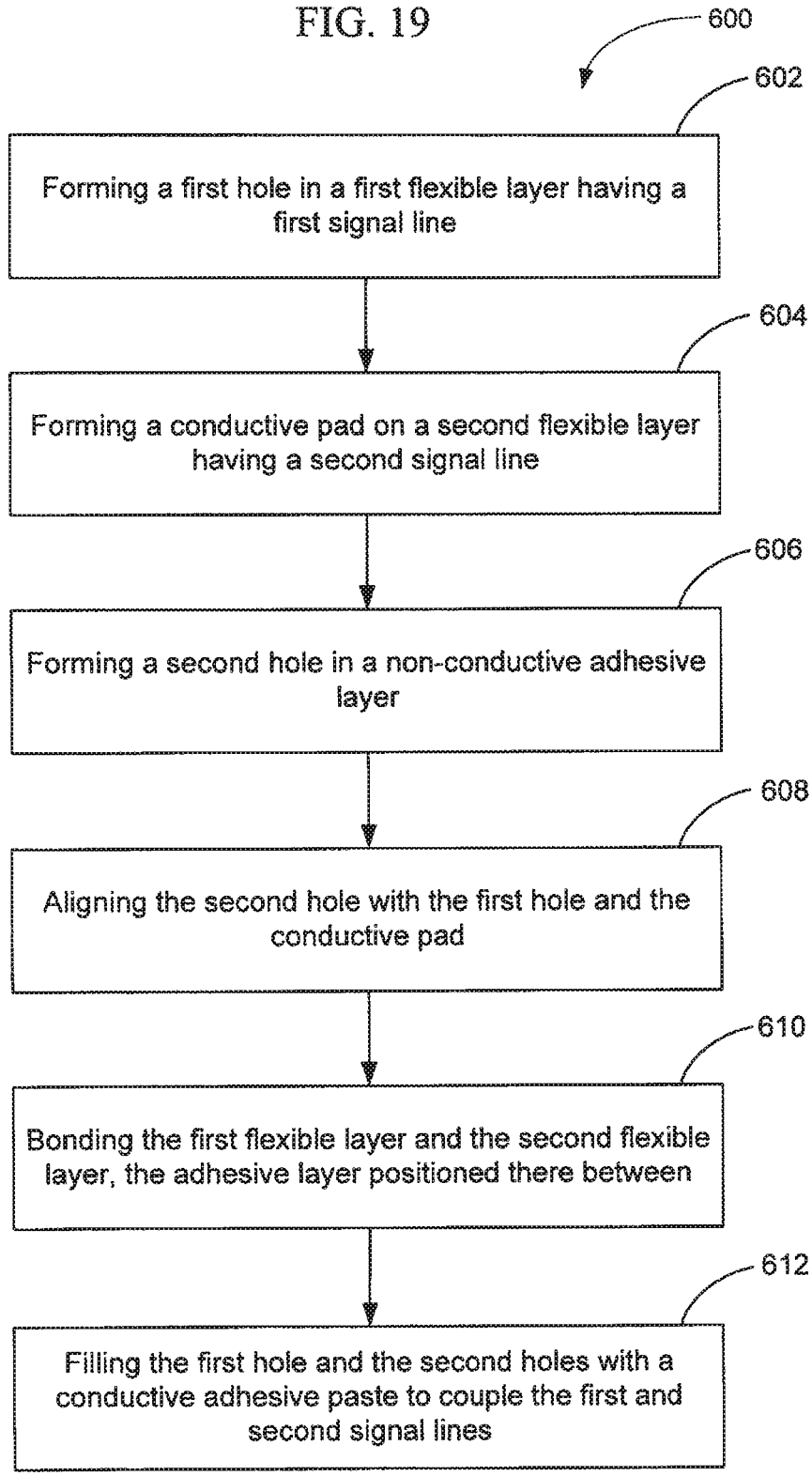

MULTI-LAYER MICROWAVE CORRUGATED PRINTED CIRCUIT BOARD AND METHOD

CROSS-REFERENCE TO RELATED APPLICATION(S)

This application is a continuation of U.S. patent application Ser. No. 12/534,077, filed Jul. 31, 2009, entitled "MULTI-LAYER MICROWAVE CORRUGATED PRINTED CIRCUIT BOARDS AND METHOD", now abandoned.

STATEMENT REGARDING FEDERALLY SPONSORED RESEARCH OR DEVELOPMENT

This invention was made with Government support from the Defense Advanced Research Projects Agency (DARPA) for the integrated Sensor Is Structure (ISIS) program and under contract number FA8750-06-C-0048. The U.S. Government has certain rights in this invention.

BACKGROUND

The present invention relates generally to printed circuit boards for use in communication systems. More specifically, the invention relates to multi-layer microwave corrugated printed circuit boards and methods for interconnecting the printed circuit boards.

Next generation large area multifunction active arrays for applications such as space and airborne based antennas need to be lighter weight, lower cost and more conformal than what can be achieved with current active array architecture and multilayer active panel array development. These space and airborne antennas can be used for radar and communication systems, including platforms such as micro-satellites and stratospheric airships.

The trend toward thinner and lighter multilayer mixed signal printed circuit board (PCB) panels integrating monolithic microwave integrated circuit (MMIC) and digital integrated circuits as well as power components is driven by installation requirements for these future platforms such as airships and micro-satellites. Minimizing the weight of these panels and the devices located thereon while maintaining panel strength sufficient to be part of an aircraft secondary structure are important design considerations. Conventional JCB construction for multi-layer mixed signal panels can be too complex and heavy to meet weight reduction requirements. A number of challenges for meeting the weight reduction requirements exist. For example, in conventional PCB construction, the circuit layers are generally laminated together with full sheets of bond ply adhesive film, which can contribute significantly to the weight of the panel. Accordingly, there is a need for a light weight PCB assembly that provides robust structural characteristics.

SUMMARY OF THE INVENTION

Aspects of the invention relate to a multi-layer microwave corrugated printed circuit board. In one embodiment, the invention relates to an interconnect assembly for a corrugated printed circuit board including a first flat flexible layer having a top surface and a bottom surface and having a signal conductor and a ground conductor forming a first microstripline or microstrip transmission line, a second folded flexible layer having a top surface and a bottom surface and having a signal conductor and a ground conductor forming a second microstripline or microstrip transmission line, the bottom surface of the second folded flexible layer having ridge portions, a non-conductive adhesive layer disposed between the top surface of the first flat flexible layer and the ridge portions of the second folded flexible layer, a signal through-hole extending through the non-conductive adhesive layer and the first flat flexible layer, and connecting the signal conductor of the first flat flexible layer to the signal conductor of the second folded flexible layer, and two ground through-holes extending through the non-conductive adhesive layer and the second folded flexible layer, and connecting the ground conductor of the first flat flexible layer to the ground conductor of the second folded flexible layer, wherein the two ground through-holes are disposed on opposite sides of the signal through-hole.

BRIEF DESCRIPTION OF THE DRAWINGS

FIG. 7 is a close up view of an interconnect between a folded flex layer and a flat flex layer of a corrugated printed circuit board in accordance with one embodiment of the invention.

FIG. 8 is a top view of a portion of the interconnect of FIG. 7 including three lines of a microstrip transmission line in accordance with one embodiment of the invention.

FIG. 9 is a cross sectional inverted view of the flat flex layer of FIG. 7 in accordance with one embodiment of the invention.

FIG. 10 is an exploded cross sectional view of an interconnect of a folded flex layer and a flat flex layer with an adhesive layer positioned there between in accordance with one embodiment of the invention.

FIG. 11 is an exploded cross sectional view of the interconnect of FIG. 10 taken along section A-A.

FIGS. 17a-17c are assembly drawings of a process for assembling a corrugated printed circuit board in accordance with one embodiment of the invention.

FIGS. 18a-18c are assembly drawings of another process for assembling a corrugated printed circuit board in accordance with one embodiment of the invention.

FIG. 19 is a flow chart of a process for forming an interconnect for a corrugated printed circuit board in accordance with one embodiment of the invention.

DETAILED DESCRIPTION OF THE INVENTION

Figure 1:
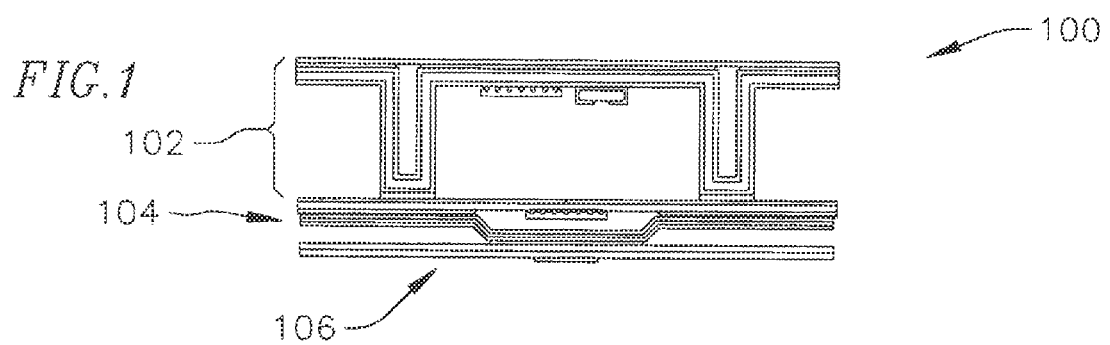
FIG. 1 is a side view of a corrugated printed circuit board in accordance with one embodiment of the invention.

Referring now to the drawings, embodiments of systems and methods for interconnecting components of corrugated printed circuit boards (PCBs) are illustrated. In a number of embodiments, the corrugated PCBs include a first flexible layer having a first signal line on a surface of the first flexible layer and a second flexible layer having a second signal line on a surface of the second flexible layer. Embodiments of methods for forming an interconnect between the first and second layers can include forming a first hole in the first flexible layer, a conductive pad on the second flexible layer, and a second hole in a non-conductive adhesive layer disposed between the first and second layers, aligning the second hole with the first hole and the conductive pad, bonding the first flexible layer and the second flexible layer, and filling the first hole and the second hole with a conductive paste to electrically couple the first signal line with the second signal line.

In several embodiments, the first layer includes multiple through holes aligned with corresponding through holes in the non-conductive adhesive layer and multiple pads on the second layer. For example, in one embodiment, the first layer includes three through holes aligned with three through holes in the non-conductive adhesive layer and three pads on the second layer. In one embodiment, the first layer is a flat flexible circuit layer and the second layer is a folded flexible circuit layer. Together the layers can form a corrugated circuit board structure. In another embodiment, the first layer is a folded flexible circuit layer and the second layer is a flat flexible circuit layer. In some embodiments, the corrugated PCBs can include more than two layers. In a number of embodiments, interconnects are formed at multiple locations on surfaces of the first and second layers.

While not bound by any particular theory, architects have known for years that an arch with the proper curve is the strongest way to span a given space. Embodiments of the corrugated PCBs described herein incorporate this same principle when they include arches in the corrugated medium. These arches are known as flutes and when contact portions (or ridge portions) of the flutes are anchored to a linerboard with an adhesive, they resist bending and pressure from all directions. Corrugated fiberboard, or combined board, has two main components: the linerboard and the medium. Both are made of a special kind of heavy paper called container board for cardboard applications (e.g., boxes). Linerboard is the flat facing that adheres to the medium. The medium is the wavy, fluted paper in between the liners.

The corrugation manufacturing processes are most commonly used to make boxes having one layer of fluting between two smooth sheets. When a piece of combined board is placed on its end, the arches form rigid columns, capable of supporting a great deal of weight. When pressure is applied to the side of the board, the space in between the flutes acts as a cushion to protect the container's contents.

The flutes also serve as an insulator, providing some product protection from sudden temperature changes. At the same time, the vertical liner board provides more strength and protects the flutes from damage. Flutes come in several standard shapes or flute profiles.

Embodiments of multi-layer corrugated printed circuit boards can be made of flexible circuit board material configured in an alternating combination of arched layers between smooth sheets. In some embodiments, the corrugated PCBs are used as with microwave and/or mixed signal designs. Corrugation is applied to the manufacturing of multi-layer printed flex circuit boards to created extremely durable, versatile, economical and lightweight assemblies of microwave multi-chip mixed signal electronic panels used for airborne platforms such as airships and micro-satellites where weight and cost are important factors. Microwave, digital and power integrated circuits (ICs) can be attached with reflowed solder paste on top or in between the layer and folds as shown in FIG. 1 using standard flip chip surface mounting techniques. Microwave, digital and power signal traces can be routed along the fluted flex layers. Depending on the desired weight, component density and panel strength for a particular application, there are many types and combinations of corrugated layers available, each with different flute sizes and thicknesses. These formed layers, such as a wafer pattern, can offer enhanced structure, routing flexibility and functionality.

FIG. 1 is a side view of a corrugated printed circuit board 100 in accordance with one embodiment of the invention. In some embodiments, the corrugated PCB can be used in conjunction with an active array antenna for a radar or a communication system. The corrugated printed circuit board 100 includes a level one assembly 102, a level two assembly 104 and a level three assembly 106. The level one assembly 102 can include one or more apertures, an radio frequency (RF) feed, electronic components and power and communication signals. The level two assembly 104 can include an RF feed, electronic components and power and communication signals. The level three assembly 106 can also include an RF feed, electronic components and power and communication signals. An example of a printed circuit board having a multiple assembly levels is described in U.S. Pat. No. 7,525,498, the entire content of which is incorporated herein by reference.

Figure 2:
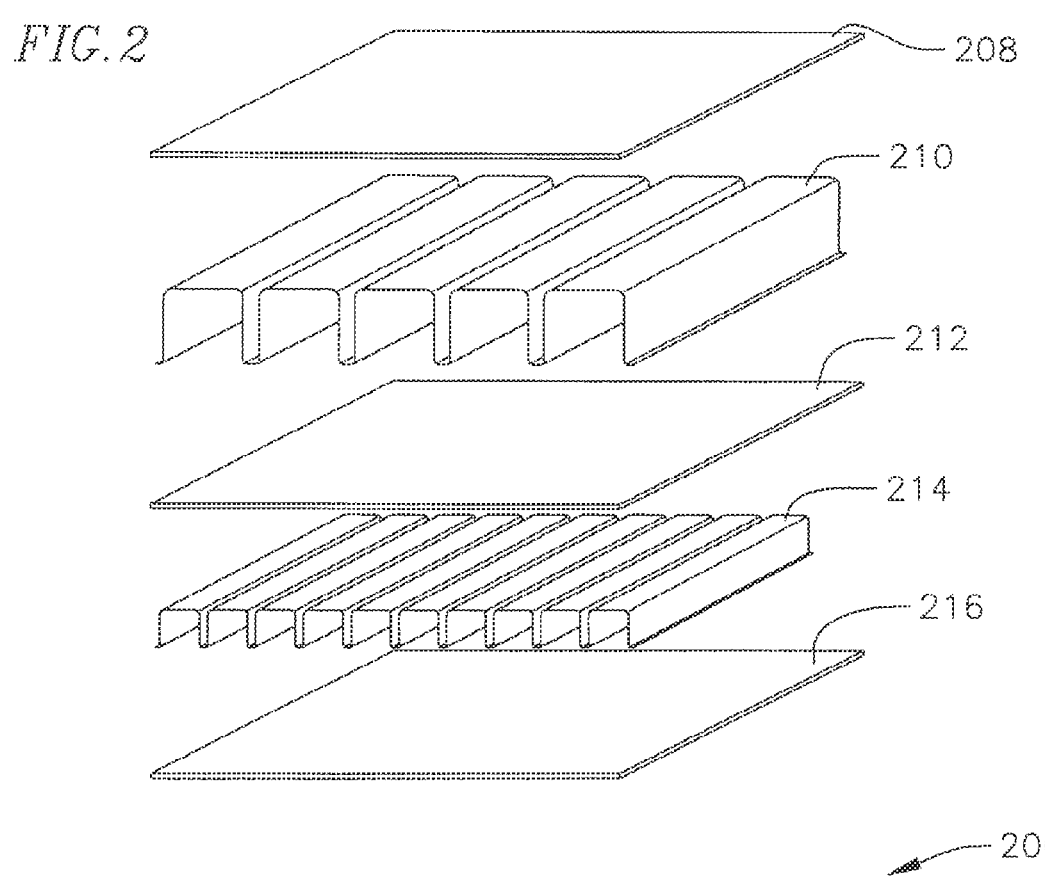
FIG. 2 is a exploded perspective view of a two layer corrugated printed circuit board in accordance with one embodiment of the invention.

FIG. 2 is a exploded perspective view of a two layer corrugated printed circuit board 200 in accordance with one embodiment of the invention. The corrugated printed circuit board 200 includes a top flat flexible layer 208, a first folded or fluted flexible layer 210, a middle flat flexible layer 212, a second folded or fluted flexible layer 214, and a bottom flat flexible layer 216. In other embodiments, the corrugated PCB can include more than two fluted layers and more than three flat layers.

In the embodiment illustrated in FIG. 2, the flutes of the first or upper fluted layer 210 extend in the same direction as the flutes of the second or lower fluted layer 214. In other embodiments, the flutes of the upper fluted layer and the lower fluted layers can extend in different directions. In one embodiment, the flutes of the upper fluted layer extend in a direction that is perpendicular to the flutes of the lower fluted layer, or vice versa. In other embodiments, additional fluted layers are included and the flutes of each fluted layer can extend in the same direction, or in different directions. In the embodiment illustrated in FIG. 2, the fluted layers have a specific height and width for the flutes. In other embodiments, the fluted layers can have other heights and widths for the flutes.

Figure 3:
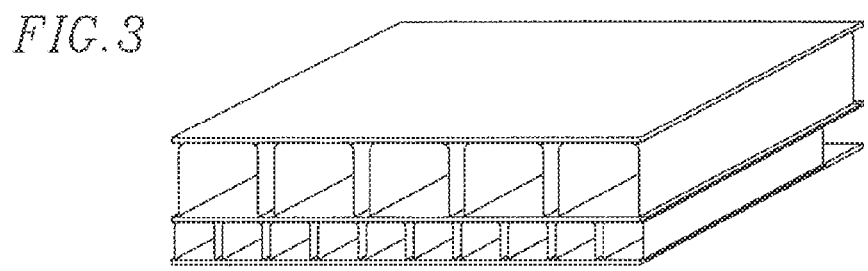
FIG. 3 is a perspective view of the two layer corrugated printed circuit board of FIG. 2.

FIG. 3 is a perspective view of the two layer corrugated printed circuit board 200 of FIG. 2.

Figure 4:
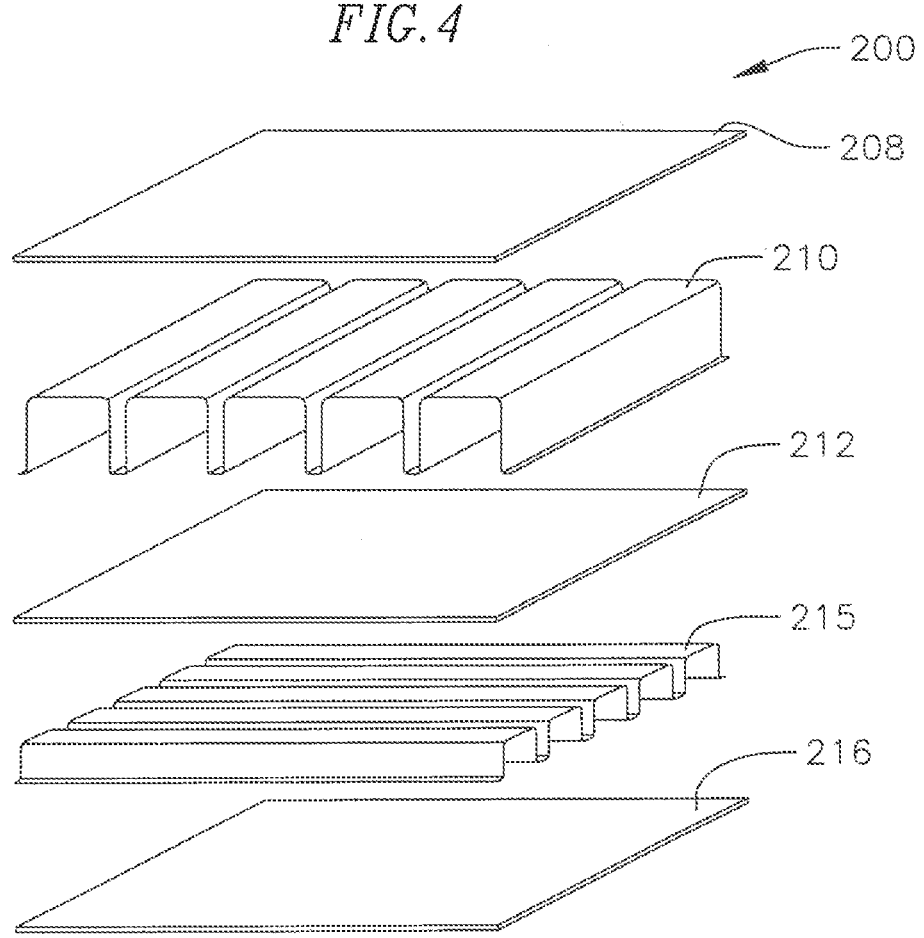
FIG. 4 is a exploded perspective view of the two layer corrugated printed circuit board of FIG. 2 in accordance with one embodiment of the invention.

FIG. 4 is a exploded perspective view of the two layer corrugated printed circuit board 200 of FIG. 2 in accordance with one embodiment of the invention. The two layer PCB 200 includes all of the same components of the embodiment illustrated in FIG. 2, except that the flutes of the second fluted flexible layer 215 extend in a direction perpendicular to the flutes of the first fluted flexible layer 210.

Figure 5:
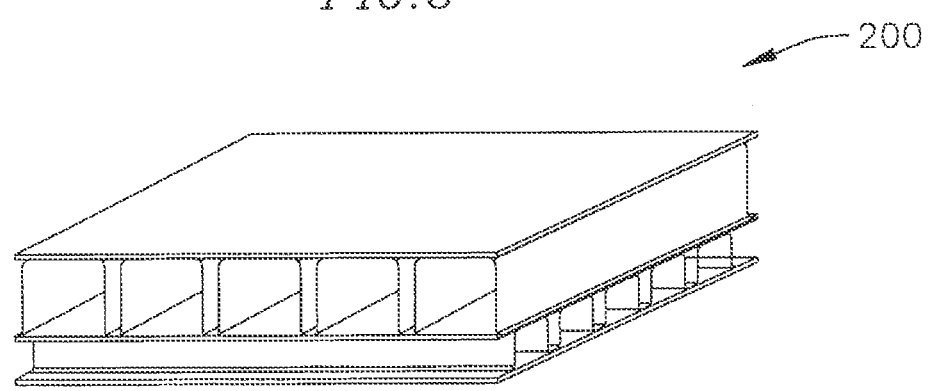
FIG. 5 is a perspective view of the two layer corrugated printed circuit board of FIG. 4.

FIG. 5 is a perspective view of the two layer corrugated printed circuit board of FIG. 4.

Figure 6:
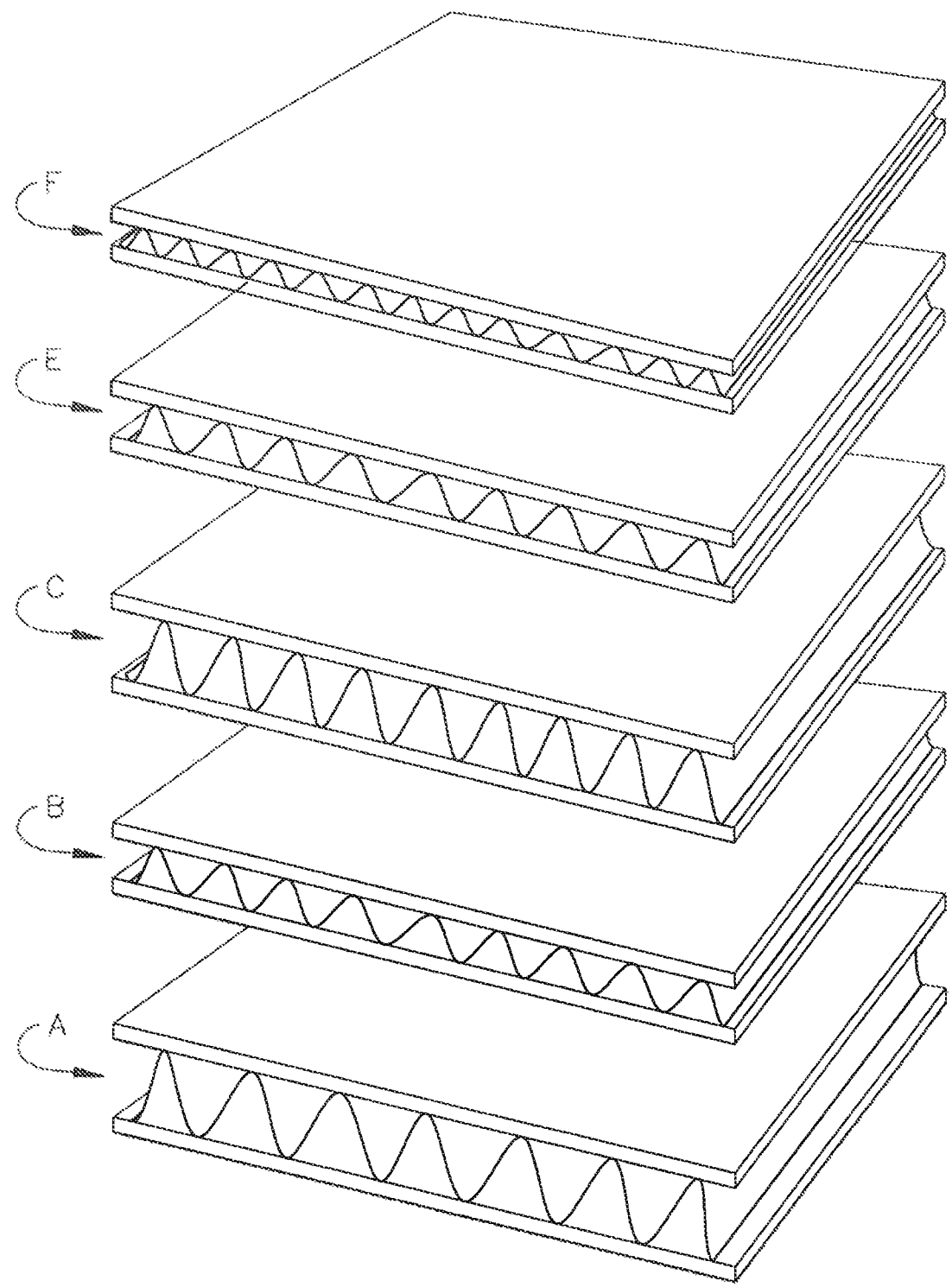
FIG. 6 is a perspective view of a number of corrugated printed circuit boards having different widths in accordance with one embodiment of the invention.

FIG. 6 is a perspective view of a number of corrugated printed circuit boards having different widths in accordance with one embodiment of the invention. Embodiments of corrugated printed circuit boards for the present invention can include flutes having several standard shapes or flute profiles (A, B, C, E, F, etc.) as shown in FIG. 6. The A-flute was the first to be developed and is one of the largest flute profiles. The B-flute was next and is much smaller. The C-flute followed and is between A and B in size. The E-flute is smaller than the B-flute and the F-flute is smaller yet. In addition to these five profiles, new flute profiles, both larger and smaller than those listed here, can be created for more specialized boards. Generally, larger flute profiles deliver greater vertical compression strength and cushioning. Smaller flute profiles provide enhanced structural capabilities. Different flute profiles can be combined in one piece of combined board. For instance, in a triple wall board, one layer of medium might be A-flute while the other two layers may be C-flute. Mixing flute profiles in this way allows designers to manipulate the compression strength, cushioning strength and total thickness of the combined board to suit requirements for particular applications.

FIG. 7 is a close up view of an interconnect 300 between a folded flex layer 310 and a flat flex layer 312 of a corrugated printed circuit board in accordance with one embodiment of the invention. The interconnect 300 further includes a dielectric adhesive layer 311 or spacer disposed between the folded flex layer 310 and the flat flex layer 312. An RF communication signal 313 passes along the flat flex layer 312 toward and through the adhesive layer 311 and then along the folded flex layer 310. In FIG. 7, the flat flex layer 312 is configured as a microstrip transmission line or microstripline for passing the RF communication signal 313. As such, the flat layer 312 has a signal conductor 315 disposed along a bottom surface of the flat layer 312 and a groundplane conductor 317 disposed along a top surface of the flat layer 312. In FIG. 7, the folded flex layer 310 is also configured as a microstrip transmission line or microstripline for passing the RF communication signal 313. As such, the folded flex layer 310 has a signal conductor 319, or microstripline, disposed along a bottom surface of the folded layer 310 and a groundplane conductor 321 disposed along a top surface of the flat layer 310.

In the embodiment illustrated in FIG. 7, the RF communication signal 313 passes along the bottom of the flat layer 312, via signal conductor 315, from right to left, transitions to the folded layer 310 via the interconnect and continues along a bottom of the folded layer 310, via signal conductor 319. In other embodiments, the RF communication signal 313 can follow other suitable paths along the flat and folded layers. In one embodiment, the dielectric adhesive layer can have a dielectric constant of 3.5. In other embodiments, the dielectric adhesive layer can have other suitable dielectric constant values. In the embodiment illustrated in FIG. 7, the folded flex layer and the flat flex layer are configured as microstripline transmission lines. In other embodiments, the folded flex layer and the flat flex layer can be configured to support other suitable types of transmission lines.

FIG. 8 is a top view of a portion of the interconnect 300 of FIG. 7 showing a three wire interconnect for connecting signal lines of a microstrip transmission line in accordance with one embodiment of the invention. The three wire interconnect includes a middle line interconnect 323 for an RF signal, and two outer line interconnects 325 and 327 for the associated ground plane signals.

FIG. 9 is a cross sectional inverted view of the flat flex layer 312 of FIG. 7 in accordance with one embodiment of the invention. The flat flex layer 312 is configured as a microstrip transmission line which includes the signal conductor trace 315 on one surface of the flat layer 312 and a ground plane 317 disposed on an opposite side of the flat layer 312, where the surfaces are separated by a dielectric layer 329. In one embodiment, the dielectric layer can have a dielectric constant of 2.9. In other embodiments, the dielectric layer can have other suitable dielectric constant values.

FIG. 10 is an exploded cross sectional view of an interconnect 400 of a folded flex layer 410 and a flat flex layer 412 with an adhesive layer 411 positioned there between in accordance with one embodiment of the invention. FIG. 11 is an exploded cross sectional view of the interconnect 400 of FIG. 10 taken along section A-A.

When the interconnect is assembled, an RF communication signal can pass along the flat flex layer 412 toward and through the adhesive layer 411 and then along the folded flex layer 410 or vice versa. The folded flex layer 410 is configured as a microstrip transmission line or microstripline for passing the RF communication signal. As such, the flat layer 410 has a signal conductor 419, or microstripline, disposed along a bottom surface of the folded layer 410 and a groundplane conductor 421 disposed along a top surface of the flat layer 410.

To form the interconnect 400, the folded layer 410 further includes conductive pads 434a, 434b and 434c and ground plane through holes 440. Conductive pad 434a is used to provide a pathway for the RF communication signal, while conductive pads 434b and 434c are used to provide pathways for groundplane signals via through holes 440. To form the interconnect 400, the adhesive layer 411 includes through holes 432a, 432b and 432c extending through the width of the layer for the RF communication and ground signals, respectively.

The flat flex layer 412 is also configured as a microstrip transmission line or microstripline for passing the RF communication signal. As such, the flat layer 412 has a signal conductor 415 disposed along a bottom surface of the flat layer 412 and a groundplane conductor 417 disposed along a top surface of the flat layer 412. To form the interconnect 400, the flat layer 412 further includes through holes 436a, 436b and 436c for the RF communication and ground signals, respectively. Conductive pads surround through holes 436a, 436b and 436c on both the top groudplane layer 417 and bottom RF signal layer 415 for making electrical contact with circuit traces. The through holes 436a, 436b and 436c and surrounding conductive pads provide pathways for the RF communication signal and groundplane signals, respectively. In a number of embodiments, the through holes discussed herein are plated through holes.

Figure 12:
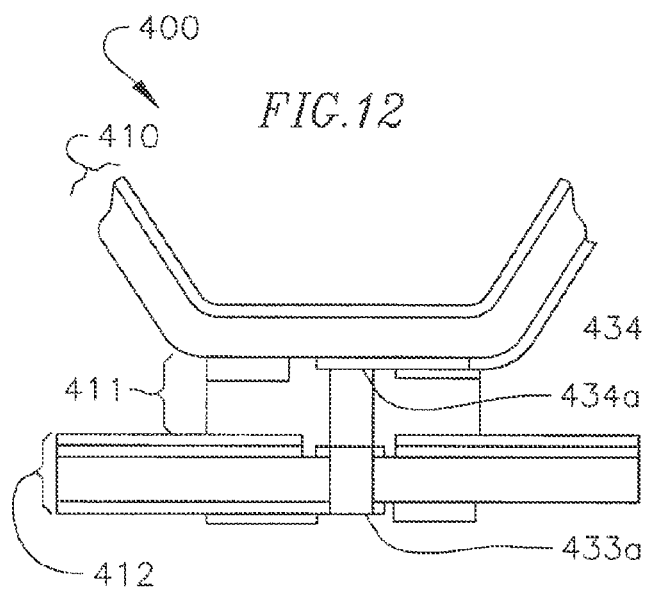
FIG. 12 is a cross sectional view of the interconnect of FIG. 10 illustrating a through hole extending through the flat flex layer and the adhesive layer to a conductor pad positioned on the folded flex layer of the interconnect.

FIG. 12 is a cross sectional view of the interconnect 400 of FIG. 10 illustrating a through hole 433a extending through the flat flex layer 412 and the adhesive layer 411 to a conductor pad 434a positioned on the folded flex layer 410 of the interconnect. Adhesive layer through hole 432a and flat flex layer through hole 436a are aligned to form through hole 433a extending through both layers to the conductor pad 434a positioned on the folded flex layer 410.

Figure 13:
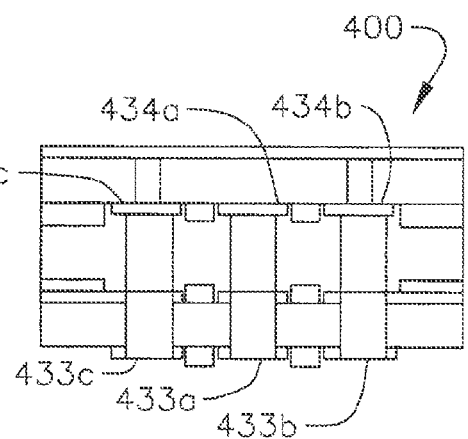
FIG. 13 is a cross sectional view of the interconnect of FIG. 10 taken along the section A-A which illustrates three through holes extending through the flat flex layer and the adhesive layer to conductor pads positioned on the folded flex layer of the interconnect.

FIG. 13 is a cross sectional view of the interconnect 400 of FIG. 10 taken along the section A-A which illustrates three through holes (433a, 433b, 433c) extending through both the flat flex layer 412 and the adhesive layer 411 to the conductor pads (434a, 434b, 434c) positioned on the folded flex layer 410 of the interconnect.

Figure 14:
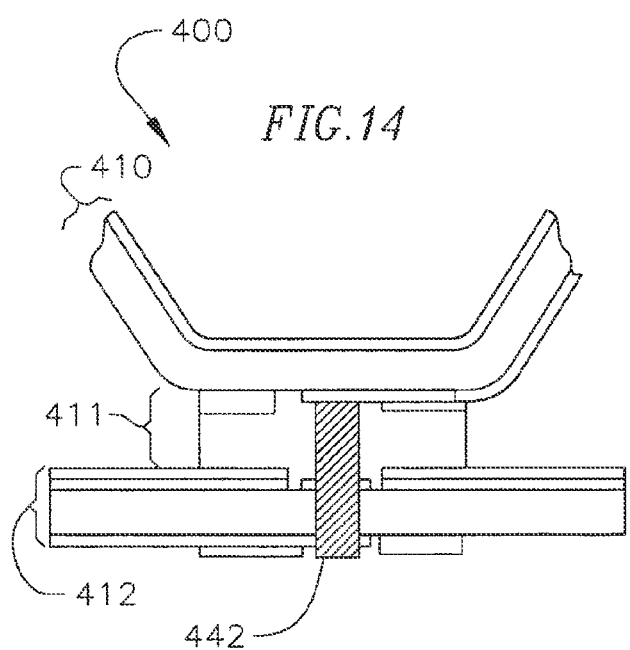
FIG. 14 is a view of the interconnect of FIG. 12 after conductive paste has been inserted into the through hole.

FIG. 14 is a view of the interconnect of FIG. 12 after conductive paste 442 has been inserted into through hole 433a. In some embodiments, the conductive paste also has adhesive properties.

Figure 15:
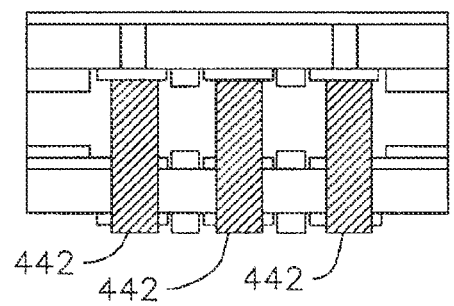
FIG. 15 is a view of the interconnect of FIG. 13 after conductive paste has been inserted into the three through holes.

FIG. 15 is a view of the interconnect of FIG. 13 after conductive paste 442 has been inserted into the three through holes (433a, 433b, 433c). The conductive paste completes an electrical pathway for the RF communication and ground signals, and provides additional structural support for the interconnect.

Figure 16:
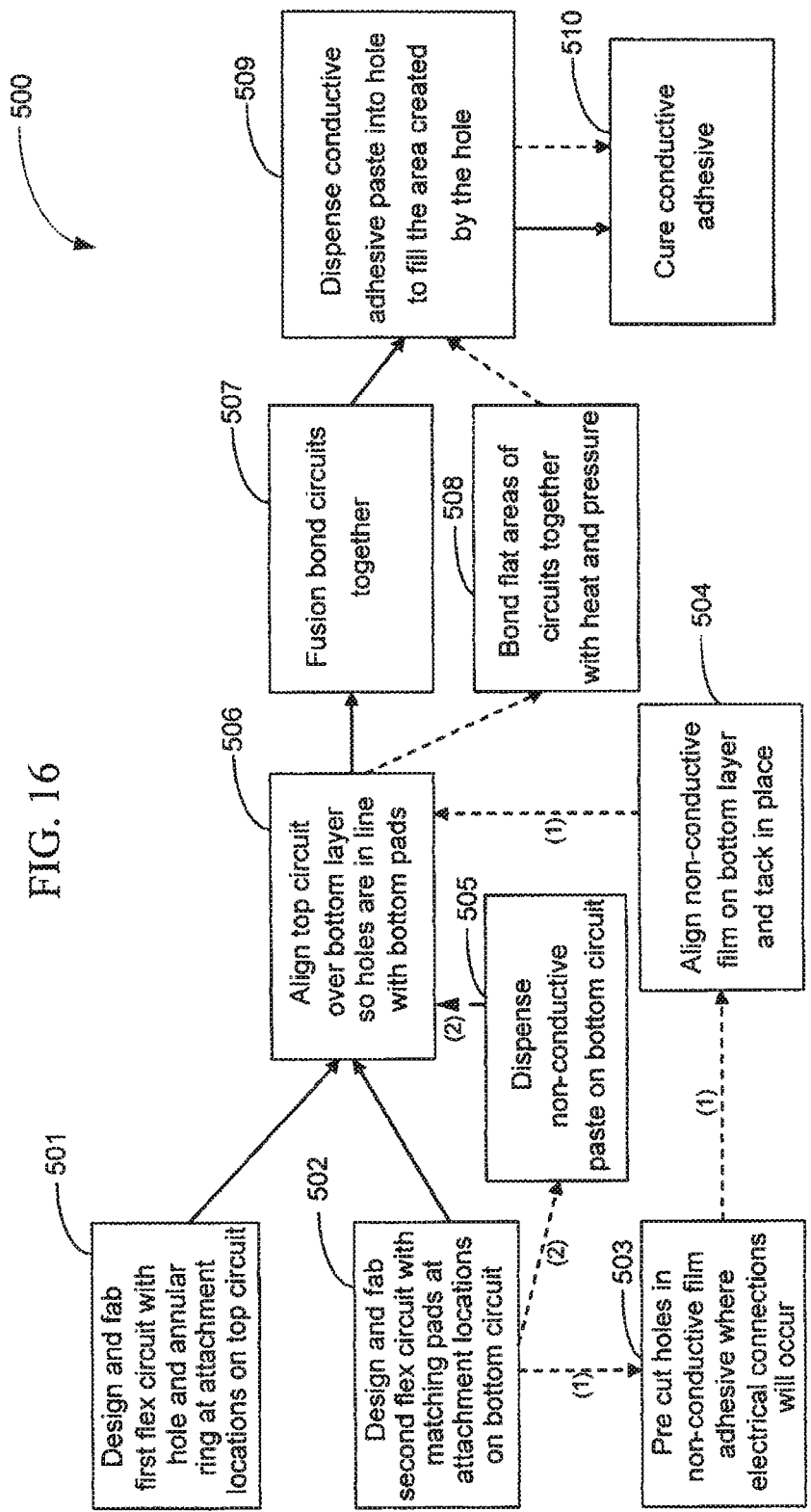
FIG. 16 is a flow chart of a process for assembling a corrugated printed circuit board in accordance with one embodiment of the invention.

FIG. 16 is a flow chart of a process for assembling a corrugated printed circuit board in accordance with one embodiment of the invention. The process 500 shows different paths to produce an interconnect that can be used to attach components of a corrugated printed circuit. In one embodiment, the process 500 produces a flexible circuit attachment using a conductive fill, disposed within an open hole of a bottom flex circuit, that forms an electrical interconnect between a conductor on the bottom flex circuit and a conductor on the top flex circuit.

The process first designs and fabricates (501) a bottom flexible circuit, or flex circuit, with a hole and an annular ring at preselected attachment locations on a top surface of the bottom flex circuit. The process also designs and fabricates (502) a top flexible circuit with conductive pads at preselected attachment locations, that correspond to the attachment locations of the bottom flex circuit, on a bottom surface of the top flex circuit. From block 502, the process can mechanically attach the flex circuits using multiple sub-processes. In a first sub-process (solid arrow path), the process aligns (506) and fusion bonds (507) the flex circuits. The aligning can include aligning the top and bottom flex circuits so that the holes are in line with the pads. In a second sub-process (dashed arrow path (2)), the process dispenses (505) a non-conductive paste on the top and/or bottom flex circuits. The process then aligns (506) the flex circuits and bonds (508) the common flat areas of the flex circuits together using heat and pressure.

In a third sub-process (dashed arrow path (1)), the process precuts (503) holes in a non-conductive film adhesive where electrical connections are intended to be positioned. The process then aligns (504) the non-conductive adhesive on the bottom and/or top flex layers and tacks it into place. The process then aligns (506) the flex circuits and bonds (508) the common flat areas of the flex circuits together using heat and pressure. Once the top and bottom flex circuits have been attached, the process dispenses (509) conductive adhesive paste into the hole(s) to fill the area created by the hole and to thereby attach the bottom flex circuit with the pad of the top flex circuit. The process then cures (510) the conductive adhesive paste.

In one embodiment, the process can perform the sequence of actions in any order. In another embodiment, the process can skip one or more of the actions. In other embodiments, one of more of the actions are performed simultaneously. In some embodiments, additional actions can be performed.

In one embodiment, the top flex circuit can be a folded flex circuit/layer and the bottom flex circuit can be flat flex circuit/layer. In such case, the bottom/flat flex circuit includes the through hole and the top/folded flex circuit includes the pad(s). In another embodiment, the top flex circuit can be a flat flex circuit/layer and the bottom flex circuit can be folded flex circuit/layer. In such case, the bottom/folded flex circuit includes the through hole and the top/flat flex circuit includes the pad(s).

In the process illustrated in FIG. 16, the process may at times refer to a single hole or pad. However, the process generally relates to use of multiple holes and pads.

FIGS. 17a-17c are assembly drawings of a process for assembling an interconnect for a corrugated printed circuit board in accordance with one embodiment of the invention. In the embodiment illustrated in FIGS. 17a-17c, the top flex circuit is folded and the bottom flex circuit is flat. FIG. 17a illustrates an exploded cross sectional assembly view of the interconnect prior to bonding. FIG. 17b illustrates a cross sectional view of the bonded interconnect assembly prior to insertion of conductive paste. FIG. 17c illustrates a cross sectional view of the bonded interconnect assembly after the holes have been filled with conductive paste. In some embodiments, the conductive paste includes adhesive properties.

FIGS. 18a-18c are assembly drawings of a process for assembling an interconnect for a corrugated printed circuit board in accordance with one embodiment of the invention. In the embodiment illustrated in FIGS. 18a-18c, the top flex circuit is flat and the bottom flex circuit is folded. FIG. 18a illustrates an exploded cross sectional assembly view of the interconnect prior to bonding. FIG. 18b illustrates a cross sectional view of the bonded interconnect assembly prior to an insertion of conductive paste. FIG. 18c illustrates a cross sectional view of the bonded interconnect assembly after the holes have been filled with conductive paste. In some embodiments, the conductive paste includes adhesive properties.

FIG. 19 is a flow chart of a process 600 for forming an interconnect for a corrugated printed circuit board in accordance with one embodiment of the invention. In a number of embodiments, the corrugated PCB includes a first flexible layer having a first signal line on a surface of the first flexible layer and a second flexible layer having a second signal line on a surface of the second flexible layer. The process begins by forming (602) at least one first hole in the first flexible layer. In several embodiments, the first hole is a plated through hole coupled to the first signal line of the first layer. The process then forms (604) a conductive pad on the second flexible layer. In several embodiments, the conductive pad is coupled to the second signal line. The process then forms (606) at least one second hole in a non-conductive adhesive layer. The process then aligns (608) the second hole with the first hole and the conductive pad. The process then bonds (610) the first flexible layer and the second flexible layer with the adhesive layer positioned between the two layers. The process completes by filling (612) the first hole and the second hole with a conductive adhesive paste to couple the first and second signal lines.

In one embodiment, the first flexible layer is a folded flex circuit and the second flexible layer is a flat flex circuit. In another embodiment, the first flexible layer is a flat flex circuit and the second flexible layer is a folded flex circuit.

In one embodiment, the process can perform the sequence of actions in any order. In another embodiment, the process can skip one or more of the actions. In other embodiments, one of more of the actions are performed simultaneously. In some embodiments, additional actions can be performed.

In one embodiment, the bonding is achieved by a fusion bonding process. In another embodiment, the bonding is achieved by bonding the common flat areas of the first flexible layer and the second flexible layer together using heat and pressure. In some embodiments, the bonding process is achieved by adding a nonconductive adhesive film to the first flexible layer and/or the second flexible layer. In other embodiments, the bonding process is achieved by adding a non-conductive paste to the first flexible layer and/or the second flexible layer.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

What is claimed is:

1. An interconnect assembly for a corrugated printed circuit board comprising:
    a first flat flexible layer having a top surface and a bottom surface and having a signal conductor and a ground conductor forming a first microstripline or microstrip transmission line;
    a second folded flexible layer comprising flutes and having a top surface and a bottom surface and having a signal conductor and a ground conductor forming a second microstripline or microstrip transmission line, the bottom surface of the second folded flexible layer having contact portions;
    a non-conductive adhesive layer disposed between the top surface of the first flat flexible layer and the contact portions of the second folded flexible layer;
    a signal through-hole extending through the non-conductive adhesive layer and the first flat flexible layer, and connecting the signal conductor of the first flat flexible layer to the signal conductor of the second folded flexible layer; and
    two ground through-holes extending through the non-conductive adhesive layer and the second folded flexible layer, and connecting the ground conductor of the first flat flexible layer to the ground conductor of the second folded flexible layer, wherein the two ground through-holes are disposed on opposite sides of the signal through-hole;
    a third flat flexible layer coupled between the second folded flexible layer; and
    a fourth folded flexible layer, the fourth folded flexible layer comprising flutes, and
    wherein the flutes of the second folded flexible layer have a size that is different from a size of the flutes of the fourth folded flexible layer.

2. The interconnect assembly of claim 1, wherein the flutes of the second folded flexible layer are smaller than the flutes of the fourth folded flexible layer.

3. The interconnect assembly of claim 1, wherein the flutes of the second folded flexible layer are greater than the flutes of the fourth folded flexible layer.

4. The interconnect assembly of claim 1, further comprising conductive paste disposed within the signal through-hole and the two ground through-holes.

5. The interconnect assembly of claim 4, wherein the conductive paste is a conductive adhesive paste.

6. The interconnect assembly of claim 1, further comprising three conductive pads coupled to the ridge portions of the second folded flexible layer, wherein the three conductive pads are respectively aligned with the signal through-hole and the two ground through-holes.

7. The interconnect assembly of claim 1, wherein the first flat flexible layer and the second folded flexible layer each comprise a dielectric layer respectively disposed between the ground conductor and the signal conductor of the first flat flexible layer and disposed between the ground conductor and the signal conductor of the second folded flexible layer.

8. The interconnect assembly of claim 7, wherein the dielectric layer has a dielectric constant of 2.9.

9. The interconnect assembly of claim 1, wherein the signal through-hole and the two ground through-holes are plated through-holes.

10. The interconnect assembly of claim 1, wherein the flutes of the second folded flexible layer extend in a first direction and the flutes of the fourth folded flexible layer extend in a second direction, the first direction and the second direction being different from each other.

11. The interconnect assembly of claim 10, wherein the first direction is perpendicular to the second direction.

* * * * *